(12) United States Patent
Hall et al.

(10) Patent No.: US 8,633,080 B2
(45) Date of Patent: Jan. 21, 2014

(54) METHODS OF MAKING MULTI-STATE NON-VOLATILE MEMORY CELLS

(75) Inventors: Mark D. Hall, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 363 days.

(21) Appl. No.: 13/004,985

(22) Filed: Jan. 12, 2011

(65) Prior Publication Data
US 2012/0175697 A1 Jul. 12, 2012

(51) Int. Cl.
*H01L 21/336* (2006.01)
(52) U.S. Cl.
USPC ............ 438/288; 438/519; 257/E21.423
(58) Field of Classification Search
USPC ............ 438/260, 519; 257/E21.177, E21.18, 257/E21.4
See application file for complete search history.

(56) References Cited

U.S. PATENT DOCUMENTS

| | | |
|---|---|---|
| 7,339,232 B2 | 3/2008 | Seo et al. |
| 7,501,677 B2 | 3/2009 | Shiraiwa et al. |
| 7,521,750 B2 | 4/2009 | Seo et al. |
| 2006/0039200 A1* | 2/2006 | Yang et al. ............ 365/189.01 |
| 2009/0108325 A1* | 4/2009 | Kang et al. ................ 257/316 |

OTHER PUBLICATIONS

Park, K., "A Novel NAND Flash Memory with Asymmetric S/D Structure Using Fringe-Field-Induced Inversion Layer", IEEE Transactions on Electron Devices, vol. 55, No. 1, Jan. 2008, pp. 404-410.

* cited by examiner

*Primary Examiner* — Cheung Lee
(74) *Attorney, Agent, or Firm* — Dan D. Hill; James L. Clingan, Jr.

(57) ABSTRACT

A semiconductor device includes a region in a semiconductor substrate having a top surface with a first charge storage layer on the top surface. A first conductive line is on the first charge storage layer. A second charge storage layer is on the top surface. A second conductive line is on the second charge storage layer. A third charge storage layer is on the top surface. A third conductive line is on the third charge storage layer. A fourth charge storage layer has a first side adjoining a first sidewall of the first conductive line and a second side adjoining a first sidewall of the second conductive line. A fifth charge storage layer has a first side adjoining a second sidewall of the second conductive line and a second side adjoining a first sidewall of the third conductive line. Source and drain regions are formed in the substrate on either side of the semiconductor device.

10 Claims, 14 Drawing Sheets

US 8,633,080 B2

METHODS OF MAKING MULTI-STATE NON-VOLATILE MEMORY CELLS

BACKGROUND

1. Field

This disclosure relates generally to an integrated circuit memory, and more specifically, to a multi-state non-volatile memory cell integration and method of operation.

2. Related Art

One type of non-volatile memory uses traps in an insulating layer for charge storage. One material used in such a manner is silicon nitride. Typically, the nitride charge storage layer is surrounded by other insulating layers such as oxide forming an oxide-nitride-oxide (ONO) structure. Charge stored within the nitride is used to manipulate a threshold voltage of the transistor, and in this manner store data. Another type of non-volatile memory uses nanocrystals for charge storage. A conventional non-volatile memory gate cell typically exists in one of two states representing either a logical zero or a logical one. To increase the capacity of a memory device without significantly increasing the size of the memory, a multi-bit memory cell may be used that is capable of storing more than two states. Non-volatile memory cells of this type, referred to herein as multi-state memory cells, have been historically implemented by controlling the amount of charge that is injected into portions of the nitride charge storage layer.

Multi-state memory cells having nitride or nanocrystals for charge storage and that rely on localization of charge are relatively robust because charge migration is minimal. More specifically, the charge does not spread out through the nitride layer, causing the stored logic states to change. In multi-state non-volatile memory cells that use multiple independent floating gates, it has been necessary to use multiple non-self-aligned masking steps to fabricate the multiple floating gates, significantly increasing the cost of the device due to the increased process complexity and larger size of the memory cell.

Therefore, there is a need for a multi-state non-volatile memory device having good data retention capabilities while also being inexpensive to manufacture.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a thin-film storage (TFS) multi-state non-volatile memory cell having multiple gates spaced relatively close together so that inversion layers in the channel regions overlap each other when adjacent gates are biased in a conductive state. There are no source/drain regions between the gates. Charge storage may be by nanocrystal or SONOS (semiconductor oxide nitride oxide semiconductor). There can be any number of gates, and in one embodiment, the number of stored states is equal to the number of gates plus one.

The semiconductor substrate described herein can be any semiconductor material or combination of materials, such as gallium arsenide, silicon germanium, silicon-on-insulator (SOI), silicon, monocrystalline silicon, the like, and combinations of the above.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

Figure 1:
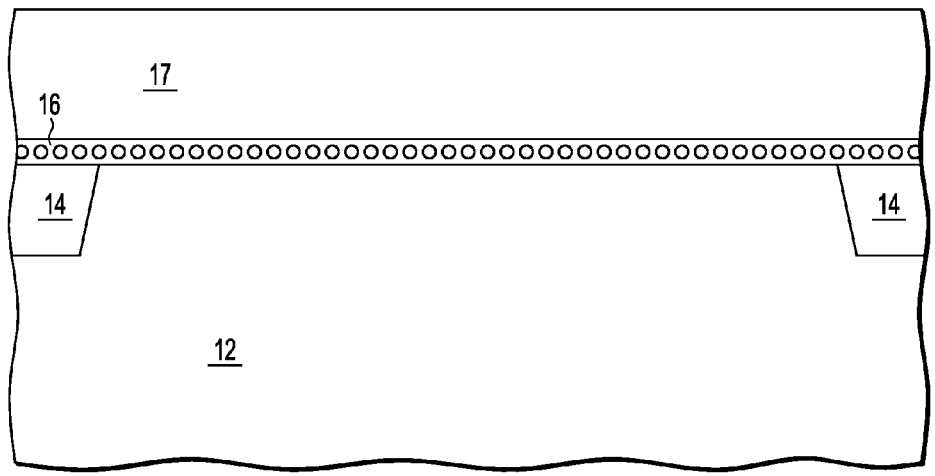
FIG. 1 through FIG. 10 illustrate cross-sectional views of a multi-state non-volatile memory cell and a method for making the multi-state non-volatile memory cell in accordance with an embodiment.

FIG. 1 through FIG. 10 illustrate cross-sectional views of a multi-state non-volatile memory cell and a method for making the multi-state non-volatile memory cell in accordance with an embodiment. FIG. 1 illustrates a cross-section of multi-state non-volatile memory cell 10 after charge storage layer 16 and conductive layer 17 are formed on semiconductor substrate 12. Semiconductor substrate 12 can be any semiconductor material or combination of materials, such as gallium arsenide, silicon germanium, silicon-on-insulator (SOI), silicon, monocrystalline silicon, the like, and combinations of the above. Shallow trench isolation (STI) 14 is first formed in substrate 12 in accordance with a conventional isolation technique. In one embodiment, to form charge storage layer 16, a dielectric stack is formed over substrate 12 and includes a first insulating layer, a charge storage layer, and a second insulating layer. The first insulating layer may be grown from substrate 12. In one embodiment, charge may be stored using a plurality of discrete charge storage elements such as nanocrystals. In the illustrated embodiment, nanocrystals are represented by the small circles in charge storage layer 16. These nanocrystals are typically formed of silicon, but the discrete storage elements may also be formed of clusters of material consisting of, for example, germanium, silicon carbide, any number of metals, or any combination of these. In another embodiment, the charge storage layer may be nitride or polysilicon. The second insulating layer is deposited on the charge storage layer. In one embodiment, the second insulating layer is a deposited oxide layer. Conductive layer 17 is formed over charge storage layer 16. Conductive layer 17 can be any type of metal, such as aluminum or copper, or another type of conductive material such as polysilicon.

Figure 2:
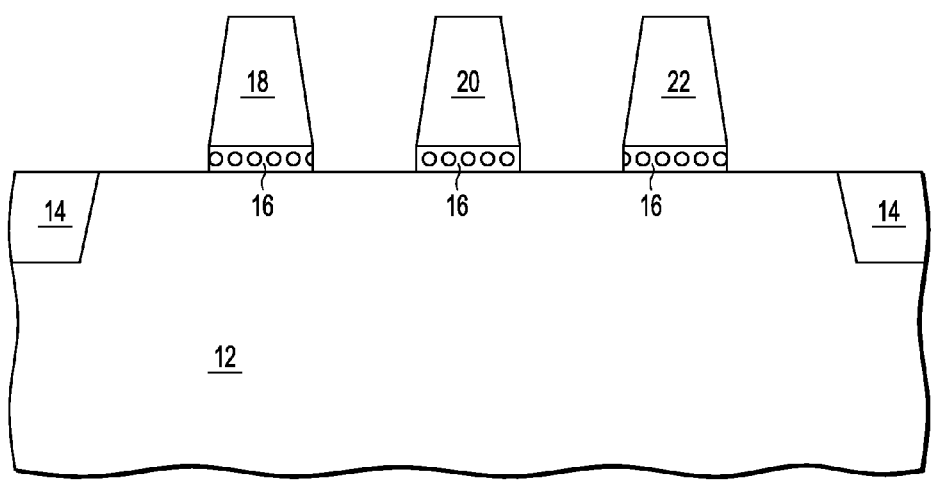

FIG. 2 illustrates a cross-section of multi-state non-volatile memory cell 10 after a photo resist layer (not shown) is formed over metal layer 17 and patterned. Conductive layer 17 and charge storage layer 16 are then etched to form gates 18, 20, and 22 as lines in conductive layer 17. The photoresist layer is then removed.

Figure 3:
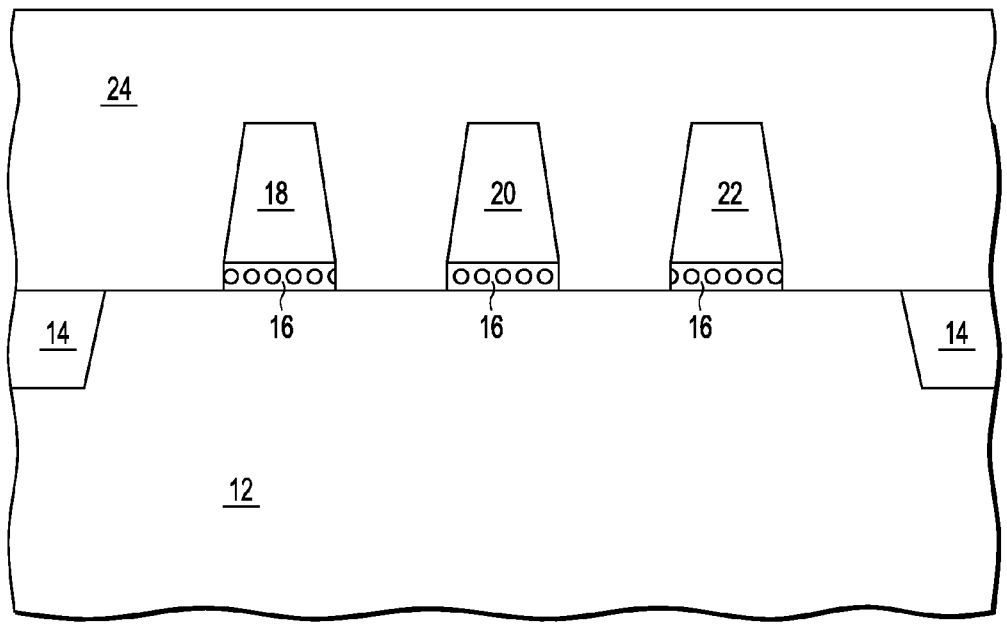

FIG. 3 illustrates a cross-section of multi-state non-volatile memory cell 10 after an insulating layer 24 is formed over gates 18, 20, 22, and over exposed portions of substrate 12. In one embodiment, insulating layer 24 is deposited silicon dioxide.

Figure 4:
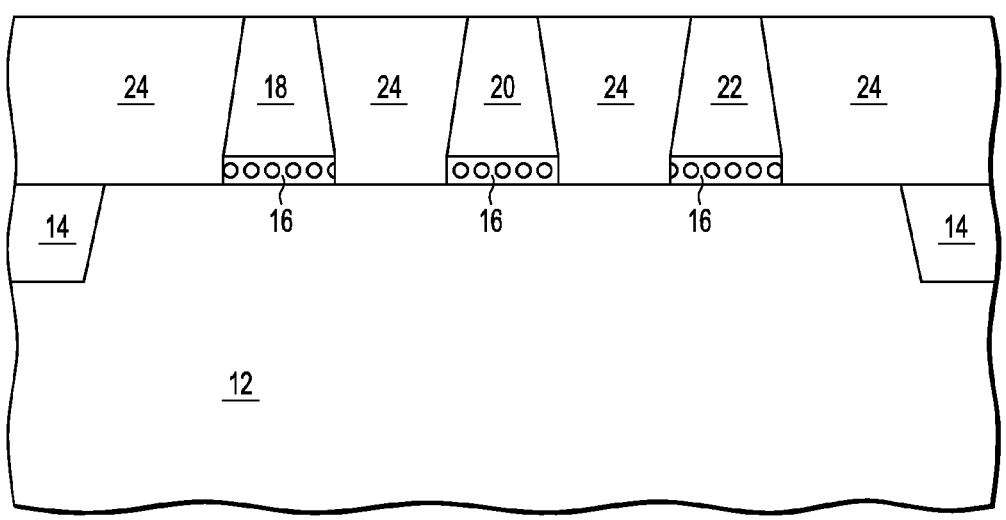

FIG. 4 illustrates a cross-section of multi-state non-volatile memory cell 10 after a conventional chemical mechanical polishing (CMP) procedure is used to remove a top portion of insulating layer 24. As illustrated in FIG. 4, in one embodiment, insulating layer 24 is polished down to the tops of gates 18, 20, and 22.

Figure 5:
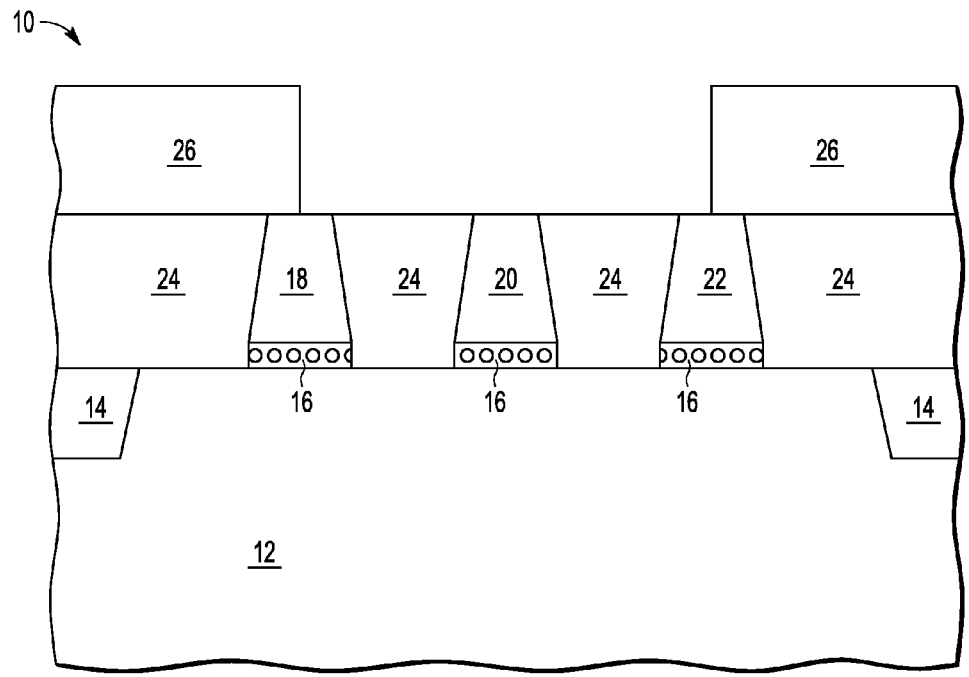

FIG. 5 illustrates a cross-section of multi-state non-volatile memory cell 10 after a photoresist layer 26 is formed over insulating layer 24 and patterned to open an area between the outermost gates 18 and 22.

Figure 6:
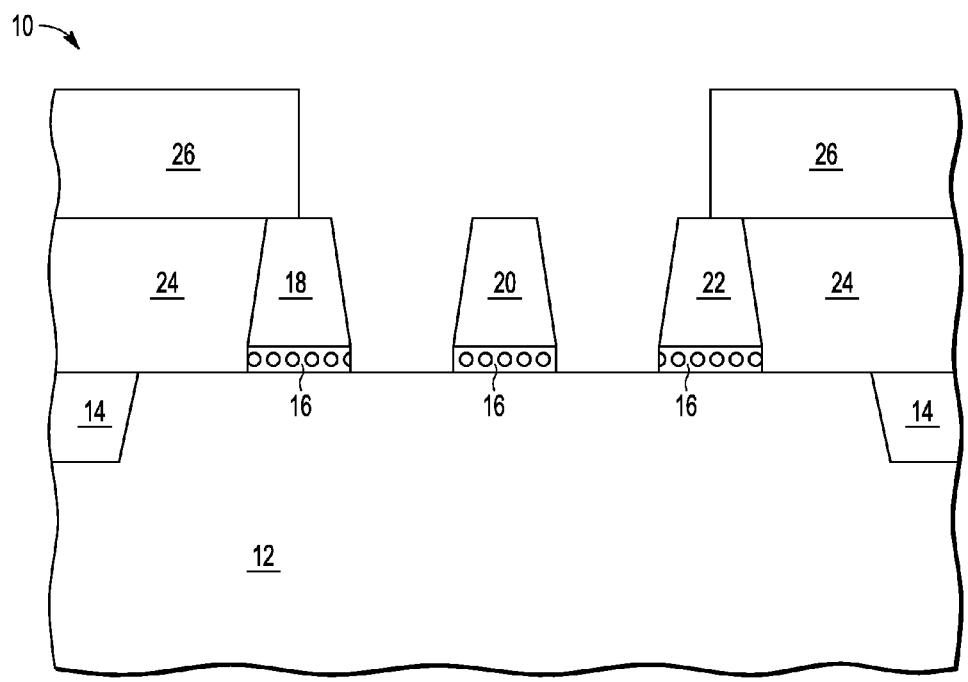

FIG. 6 illustrates a cross-section of multi-state non-volatile memory cell 10 after portions of insulating layer 24 are removed from between gates 18 and 20 and from between gates 20 and 22.

Figure 7:
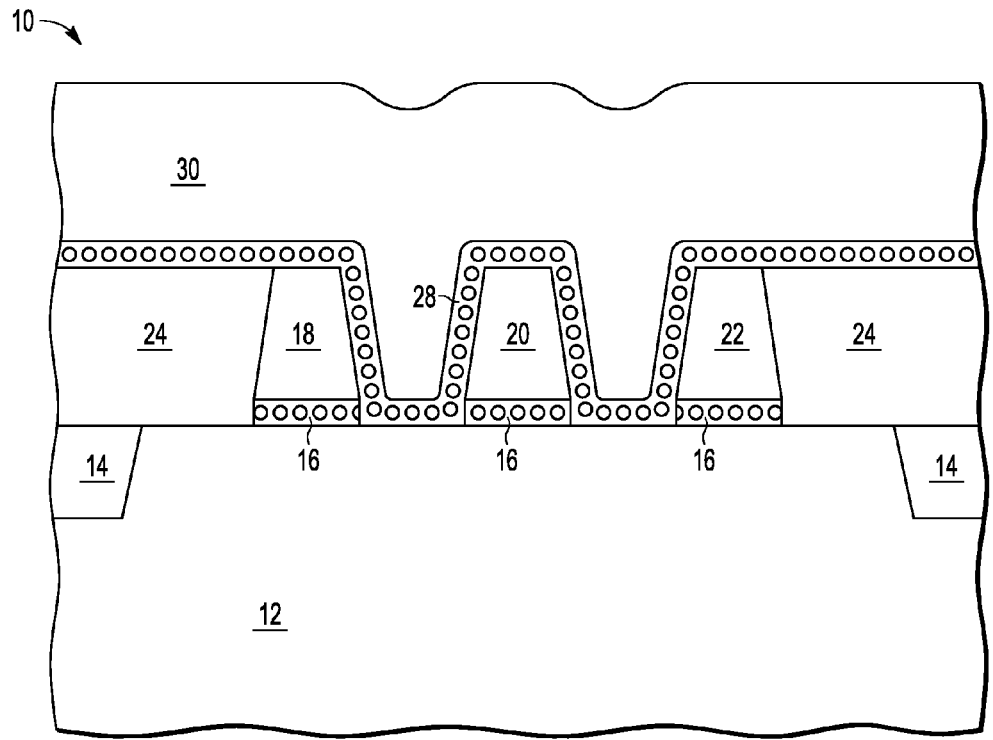

FIG. 7 illustrates a cross-section of multi-state non-volatile memory cell 10 after a conductive layer 30 is deposited over a charge storage layer 28. Charge storage layer 28 is over gates 18, 20, and 22, over substrate 12 between the gates, and over insulating layer 24. Charge storage layer 28 is formed to be substantially the same as charge storage layer 16. Conductive layer 30 may be formed from a metal or other conductive material such as polysilicon. Generally, in one embodiment, conductive layer 30 comprises the same type of material as in gates 18, 20, and 22.

Figure 8:
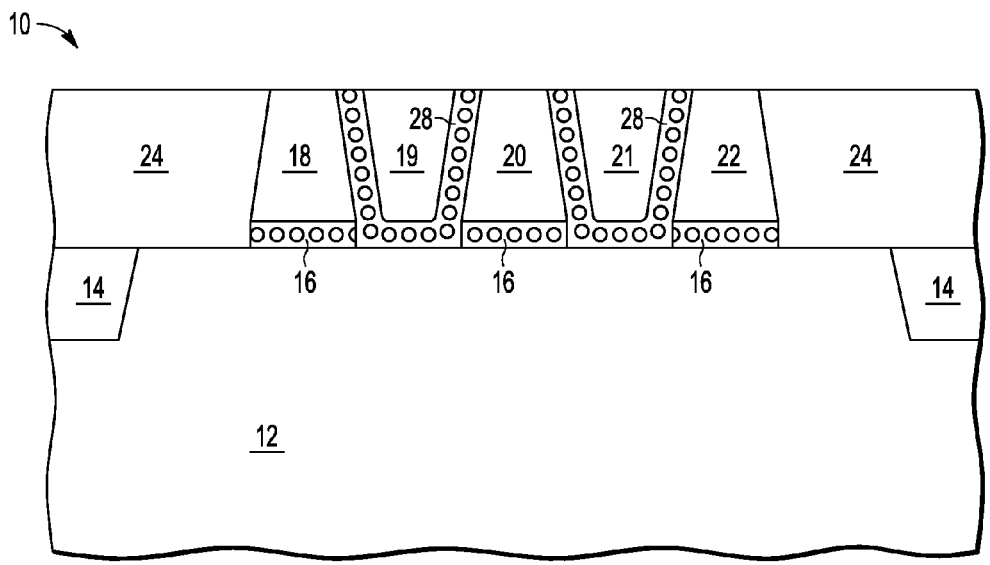

FIG. 8 illustrates a cross-section of multi-state non-volatile memory cell 10 after a conventional CMP process is used to remove a portion of conductive layer 30. In one embodiment, conductive layer 30 and charge storage layer 28 are removed to the tops of gates 18, 20, and 22 to form gates 19 and 21. As can be seen in FIG. 8, gates 18, 19, 20, 21, and 22 are insulated from each other by only the insulating layers that form a portion of charge storage layers 16 and 28.

Figure 9:
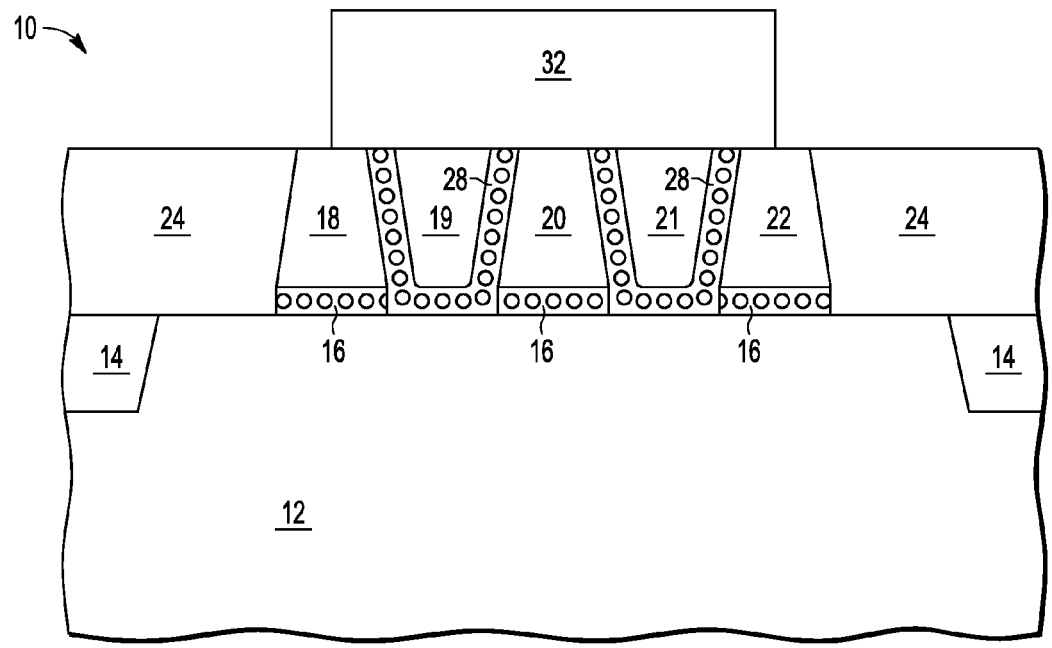

FIG. 9 illustrates a cross-section of multi-state non-volatile memory cell 10 after photoresist layer 32 is formed and patterned. Insulating layer 24 is then removed from areas not covered by patterned photoresist layer 32 using conventional etching techniques.

Figure 10:
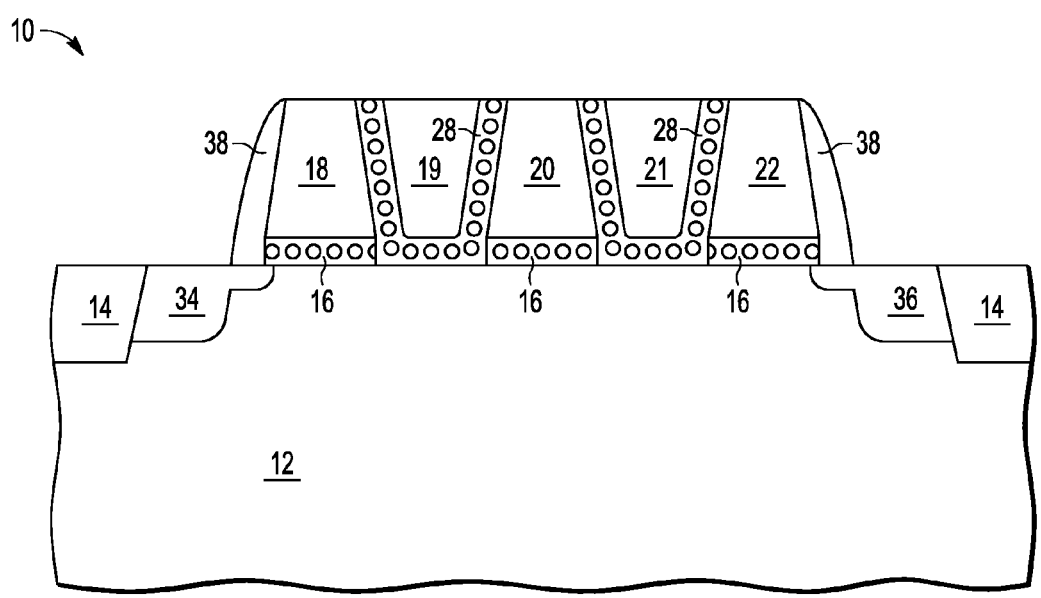

FIG. 10 illustrates a cross-section of multi-state non-volatile memory cell 10 after further processing to form source region 34, drain region 36, and spacers 38. Note that source region 34 and drain region 36 also include extensions under spacers 38. Also formed, but not illustrated, are other features necessary to complete a device, such as for example, silicide, contacts, various implant and clean steps, and additional metal layers.

Figure 11:
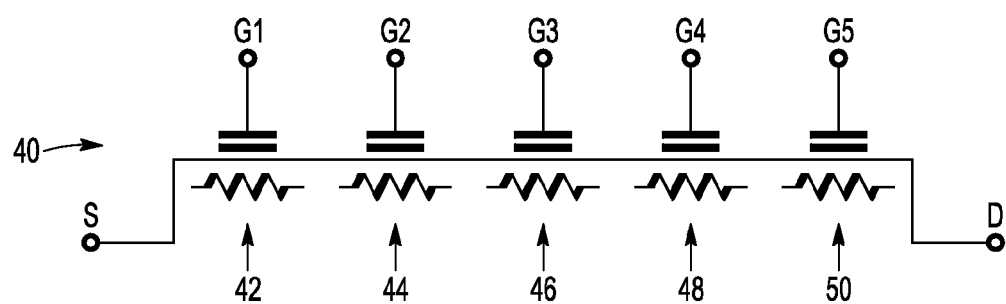
FIG. 11 illustrates, in partial schematic diagram form, a multi-state non-volatile memory cell and a method for programming the non-volatile memory cell in accordance with an embodiment.

FIG. 11 illustrates, in partial schematic diagram form, multi-state non-volatile memory cell 40 and a method for programming the non-volatile memory cell in accordance with an embodiment. Multi-state non-volatile memory cell 40 is a schematic representation of multi-state non-volatile memory cell 10. Multi-state non-volatile memory cell 40 includes five gate terminals labeled G1-G5 and includes state storage units 42, 44, 46, 48, and 50. A resistor symbol under each of gates G1-G5 indicates a channel portion controlled by each of the gates. Because the cells are separated only by charge storage layer 28, inversion layers of the cell overlap. The overlapping inversion layers cause a continuous conductive channel to be formed between the source (S) and drain (D) terminals of memory cell 40 when all of gates G1-G5 are biased correctly.

The voltages used to program various state storage units of multi-state non-volatile memory 40 are illustrated in FIG. 11. As illustrated, the source (S) and drain (D) are connected to power supply voltages VSS and VDD, respectively. In one embodiment, VSS is ground, and VDD is a positive power supply voltage. The gates will receive one of three voltages VP, V1, or V2. Programming voltage VP is a relatively high programming voltage. Voltage V1 is applied to state storage units that have not been programmed and are not being programmed in the current programming cycle. Voltage V2 is applied to state storage units that have already been programmed in a previous programming cycle. Voltage V1 is a voltage level above a threshold voltage of the state storage unit (SSU) when the SSU is in the unprogrammed state. Voltage V2 is a voltage level above a threshold voltage of the state storage unit when the SSU is in the programmed state. For simplicity, voltage V1 can be set equal to voltage V2.

State storage units 42, 44, 46, 48, and 50 are programmed in order starting with SSU 50. In the example of FIG. 11, three state storage units are programmed using three programming cycles. Programming begins with all of the state storage units in an unprogrammed state, or erased state. To program SSU 50, relatively high programming voltage VP is provided to gate G5 while voltage V1 is provided to gates G1-G4. Voltage VP is high enough to cause Fowler-Nordheim (F-N) tunneling of charge carriers. The actual voltages depend, at least in part, on the process technology used to manufacture the multi-state non-volatile memory. To program state storage unit 48, programming voltage VP is provided to gate G4 while voltage V1 is provided to gates G1-G3 and voltage V2 is provided to gate G5. To program state storage unit 46, programming voltage VP is provided to gate G3 while voltage V1 is provided to gates G1 and G2 and voltage V2 is provided to gates G4 and G5.

Multi-state memory cell 40 is read by applying a read voltage to all five gates G1-G5. The drain/source current is sensed to determine the stored logic state. Multi-state memory cell 40 can store up to six different logic states. Generally, in other embodiments having more or fewer gates, the multi-state memory cell can store a number of states equal to the number of gates plus one. The number of gates is limited by the ability of the comparator circuitry to sense and differentiate the currents among the various states.

Multi-state memory cell 40 is erased by applying a relatively high erase voltage VE to any or all five gates G1-G5 with the source (S) and drain (D) connected to power supply voltage VSS. In one embodiment, VSS is ground and voltage VE is a negative voltage.

Figure 12:
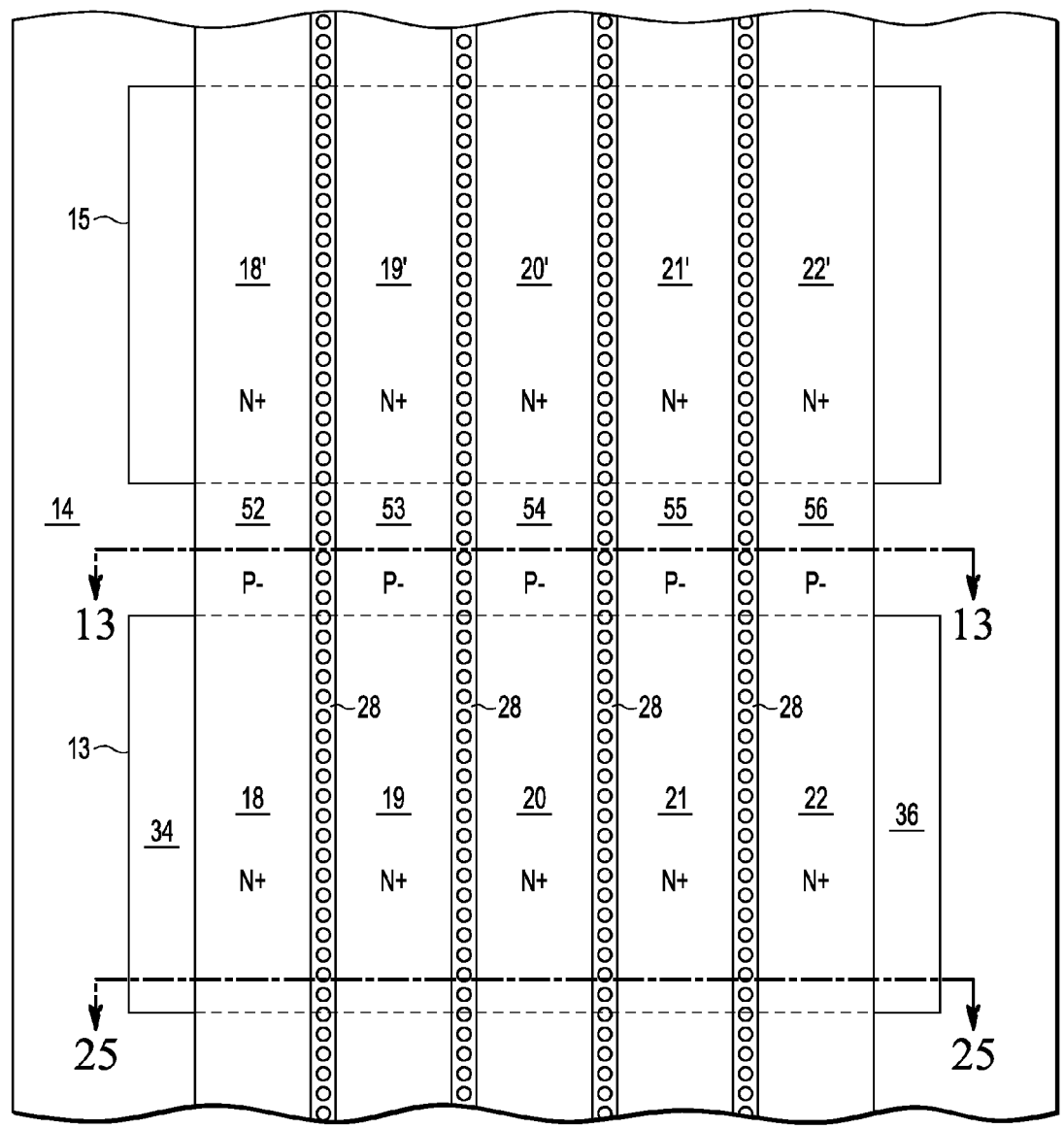
FIG. 12 illustrates a top down view of a non-volatile memory cell in accordance with an embodiment.
Figure 25:
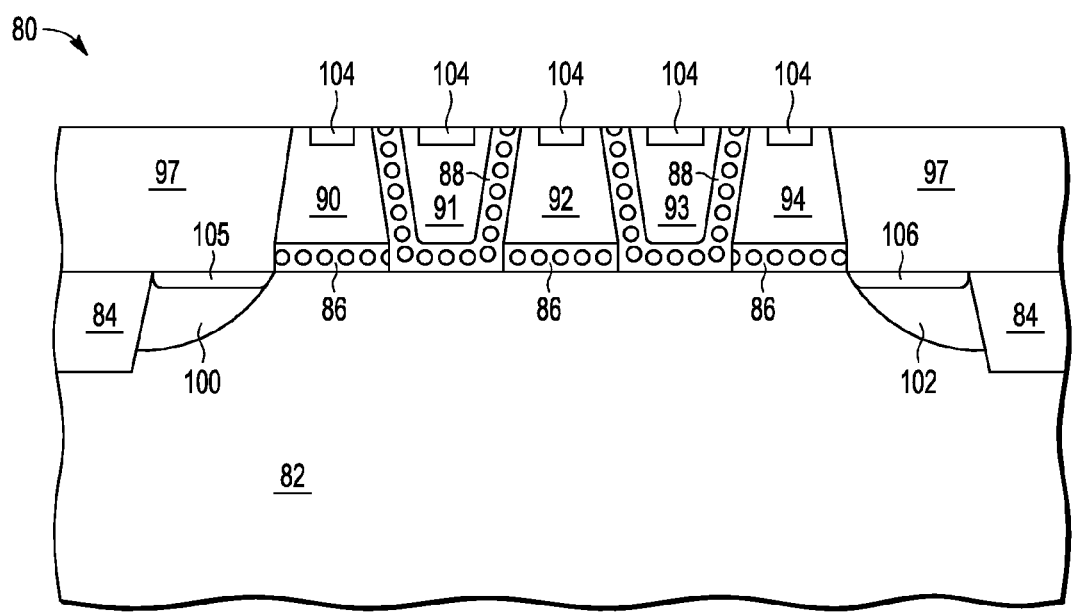

FIG. 12 illustrates a top down view of a multi-state non-volatile memory cell in accordance with another embodiment. In FIG. 12, active regions 13 and 15 are surrounded by isolation region 14. Gates 18-22 are formed over active regions 13 and 15 using lines of N+ polysilicon. The gates are separated by charge storage layer 28. Source/drain regions 34 and 36 are formed adjacent to gate 18 and gate 22. P− regions 52-56 are formed in the polysilicon between the N+ regions and over the isolation region 14 between active regions 13 and 15. As discussed above regarding multi-state memory cells 10 and 40, state storage units are formed by gates 18-22 and their underlying channel regions. Another memory cell is formed over active region 15 having gates 18'-22' formed in the same N+ polysilicon as gates 18-22. In FIG. 12, additional state storage units are formed laterally in the polysilicon layers. For example, one state storage unit has a gate formed by P− region 52, and a corresponding channel region in P− region 53. The gate and channel region are separated by charge storage layer 28. Source and drain regions are formed by N+ regions 19 and 19'. Likewise, another state storage unit is formed laterally by P− region 53 (gate), charge storage layer 28, P− region 54 (channel), and N+ regions 20 (source/drain) and 20' (source/drain). As can be seen in FIG. 12, four state storage units can be formed using the five N+ polysilicon gate conductors used to form gates 18-22 and gates 18'-22'. Cross-sectional views of the multi-state non-volatile memory cell of FIG. 12 are illustrated along line 13-13 (FIG. 13) and along line 25-25 (FIG. 25).

Figure 13:
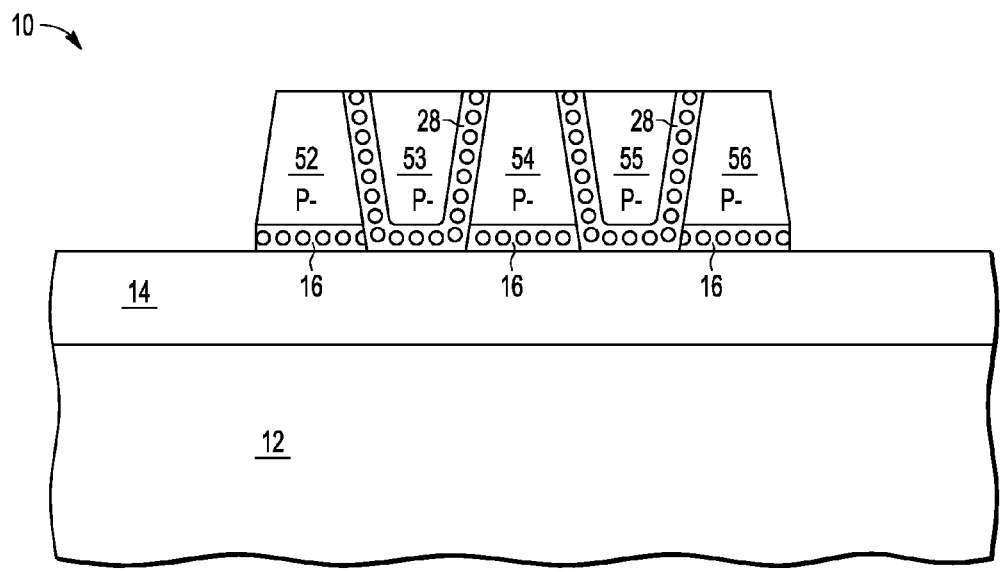
FIG. 13 illustrates a cross-sectional view of a portion of the non-volatile memory cell of FIG. 12 along the line 13-13.

FIG. 13 illustrates a cross-sectional view of a portion of the multi-state non-volatile memory cell of FIG. 12 along the line 13-13. FIG. 13 shows substrate 12 and isolation region 14 formed thereon. Charge storage layers 16 and 28 and polysilicon gates 52-56 are formed as described below with reference to FIGS. 15-25. In operation, charge is stored in the more vertically positioned portions of charge storage layer 28 between the gates. Current flows orthogonal to the plane of the figure. Five gates are illustrated in FIG. 13; however, in other embodiments a different number of gates can be formed. The number of additional state storage units formed this way is equal to the number of gates minus one. During a read operation, each vertical, programmed, charge storage region makes the adjacent polysilicon region harder to invert, thereby reducing cell current. Programming and erasing can be accomplished using F-N tunneling.

Figure 14:
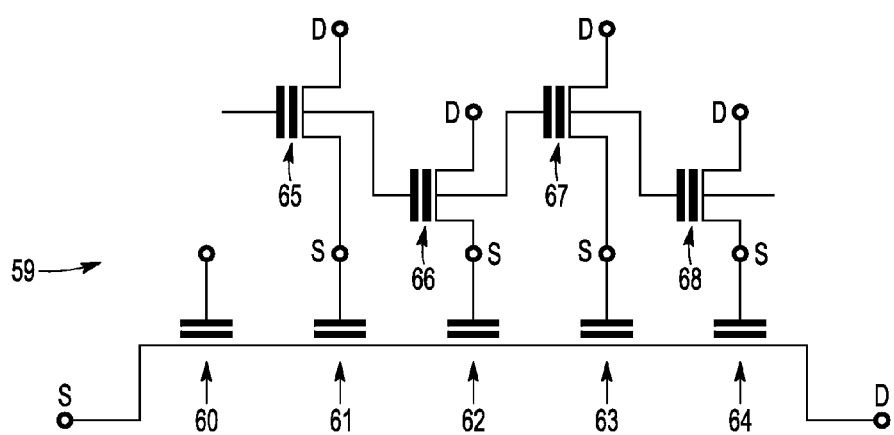
FIG. 14 illustrates, in partial schematic diagram form, a multi-state non-volatile memory cell in accordance with an embodiment.

FIG. 14 illustrates a schematic representation of a multi-state non-volatile memory cell 59 consistent with the embodiment illustrated in FIG. 12. Multi-state non-volatile memory cell 59 includes state storage units 60-68. State storage units 60-64 are substantially the same as state storage units 42, 44, 46, 48, and 50 of FIG. 11. State storage units 65-68 are formed laterally in the polysilicon layers used to form gates 52-56.

Programming of state storage units 60-64 is the basically the same as described above regarding the embodiment of FIG. 11. A method for programming one or more of state storage units 65-68 is described herein. To program, for example, SSU 68, P− poly region 56 (gate) is provided with voltage VP, N+ poly region 21 (source) is set to VSS, N+ poly region 21' (drain) is set to VSS, and P− poly region 55 (channel) is set to VSS, N+ poly regions 18-20 and 18'-20' are set to VSS, and P− poly regions 52-54 are set to VSS. (In the illustrated embodiment, VSS is ground and VDD is a positive voltage.) VP is high enough for F-N tunneling. The actual voltages depend, at least in part, on the process technology used to manufacture the multi-state non-volatile memory. The P− poly region 55 channel contact acts as a well tie, and channel current conduction is along the sidewall of P− poly region 55 closest to P− poly region 56. To avoid disturbing data stored in the horizontal state storage units, p-type substrate 12 receives a voltage of V1, where V1 is a voltage between VP and VSS that is not high enough for F-N tunneling to VSS or VP. The N+ source and drain regions of the horizontal state storage units are set to V1 to maintain low leakage.

To program state storage unit 67 after programming state storage unit 68, P− poly regions 55 and 56 are set to VP (P− poly region 55 is the gate), N+ poly region 20 is set to VSS (source), N+ poly region 20' is set to VSS (drain), and P− poly region 54 is set to VSS (channel). N+ poly regions 18, 19, 18' and 19' are set to VSS, and P− poly regions 52-53 are set to VSS.

To erase, for example, SSU 68, P− poly region 56 (gate) is set to an erase voltage (VE), and N+ poly region 21, N+ poly region 21' and P− poly region 55 (channel) are set to VSS. N+ poly regions 18-20 and 18'-20' are set to VSS, and P− poly regions 52-54 are set to VSS. Erase voltage VE is high enough for F-N tunneling. The actual voltage depends, at least in part, on the process technology used to manufacture the multi-state non-volatile memory. The P− poly region 55 channel contact acts as a well tie. To avoid disturbing data stored in the horizontal state storage units, p-type substrate 12 receives a voltage of V2, where V2 is a voltage between VE and VSS that is not high enough for F-N tunneling to VSS or VE. The N+ source and drain regions of the horizontal state storage units are set to V2 to maintain low leakage.

To read, for example, state-storage unit 68, P− poly region 56 (gate) is set to a low read voltage (VR), N+ poly region 21 (source) is set to VSS, N+ poly region 21' (drain) is set to approximately ½VDD, and P− poly region 55 (channel) is set to VSS. N+ poly regions 18-20 and 18'-20' are set to VSS, and P− poly regions 52-54 are set to VSS. The P-poly region 55 channel contact acts as a well tie, and channel current conduction is along the sidewall of P− poly region 55 closest to P− poly region 56. To minimize the impact of system noise and process variation, reads can be done from both sides of the same charge storage region and the output currents can be averaged. To avoid disturbing data stored in the horizontal state storage units, p-type substrate 12 and the N+ source and drain regions of the horizontal state storage units are set to VSS.

Figure 15:
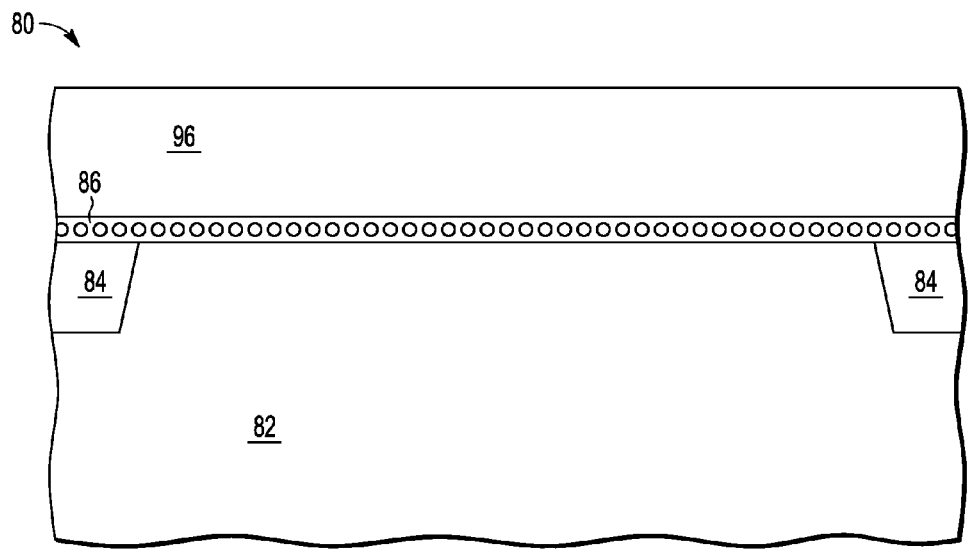
FIG. 15-FIG. 25 illustrate cross-sectional views of a multi-state non-volatile memory cell and a method for making the non-volatile memory cell in accordance with an embodiment.

FIG. 15-FIG. 25 illustrate cross-sectional views of a multi-state non-volatile memory cell and a method for making the non-volatile memory cell in accordance with an embodiment. FIG. 15 illustrates a cross-section of multi-state non-volatile memory cell 80 after charge storage layer 86 and polysilicon layer 96 are formed on semiconductor substrate 82. Semiconductor substrate 82 can be any semiconductor material or combination of materials, such as gallium arsenide, silicon germanium, silicon-on-insulator (SOI), silicon, monocrystalline silicon, the like, and combinations of the above. Shallow trench isolation (STI) 84 is first formed in substrate 82 in accordance with a conventional isolation technique. In one embodiment, to form charge storage layer 86, a dielectric stack is formed over substrate 82 and includes a first insulating layer, a charge storage layer, and a second insulating layer. The first insulating layer may be grown from substrate 82. In one embodiment, charge may be stored using a plurality of discrete charge storage elements such as nanocrystals. In the illustrated embodiment, nanocrystals are represented by the small circles in charge storage layer 86. These nanocrystals are typically formed of silicon, but the discrete storage elements may also be formed of clusters of material consisting of, for example, germanium, silicon carbide, any number of metals, or any combination of these. In another embodiment, the charge storage layer may include nitride or polysilicon instead of nanocrystals. The second insulating layer is deposited on the charge storage layer. In one embodiment, the second insulating layer is a deposited oxide layer. In one embodiment, polysilicon layer 96 is formed by depositing polysilicon over charge storage layer 86.

Figure 16:
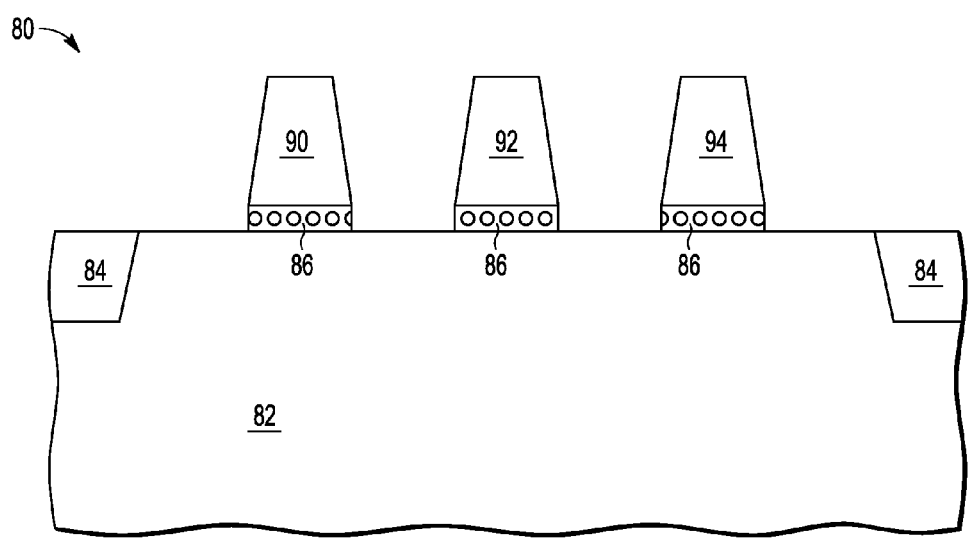

FIG. 16 illustrates a cross-section of multi-state non-volatile memory cell 80 after a photo resist layer (not shown) is formed over polysilicon layer 96 and patterned. Polysilicon layer 96 and charge storage layer 86 are then etched to form gates 90, 92, and 94 in polysilicon layer 96. The photoresist layer is then removed.

Figure 17:
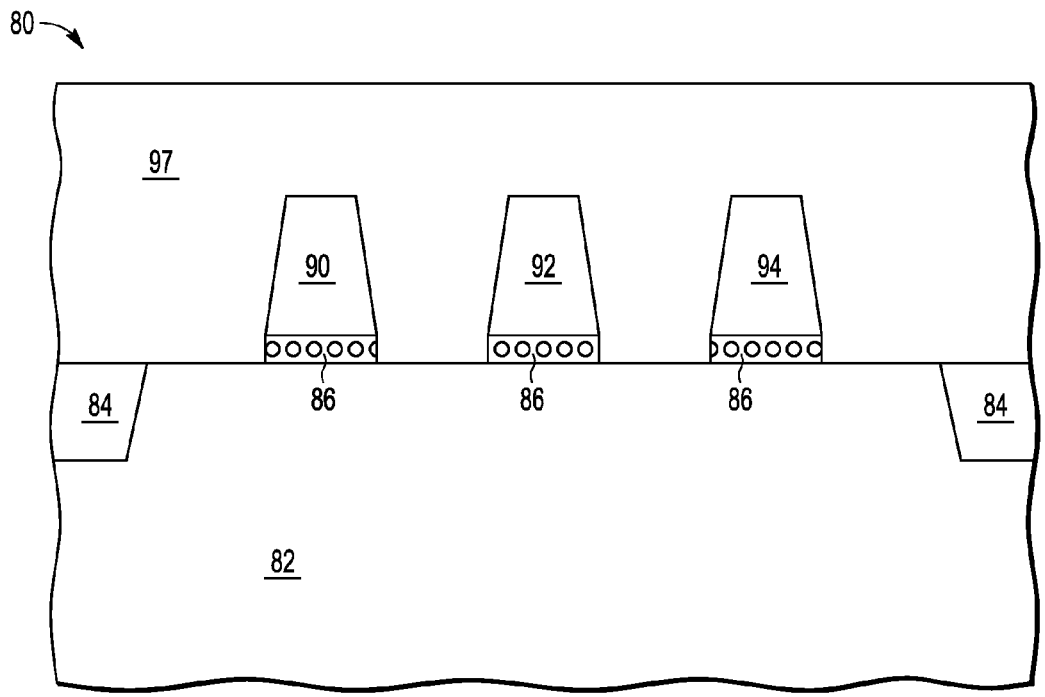

FIG. 17 illustrates a cross-section of multi-state non-volatile memory cell 80 after an insulating layer 97 is formed over gates 90, 92, and 94, and over exposed portions of substrate 82. In one embodiment, insulating layer 97 is deposited silicon dioxide.

Figure 18:
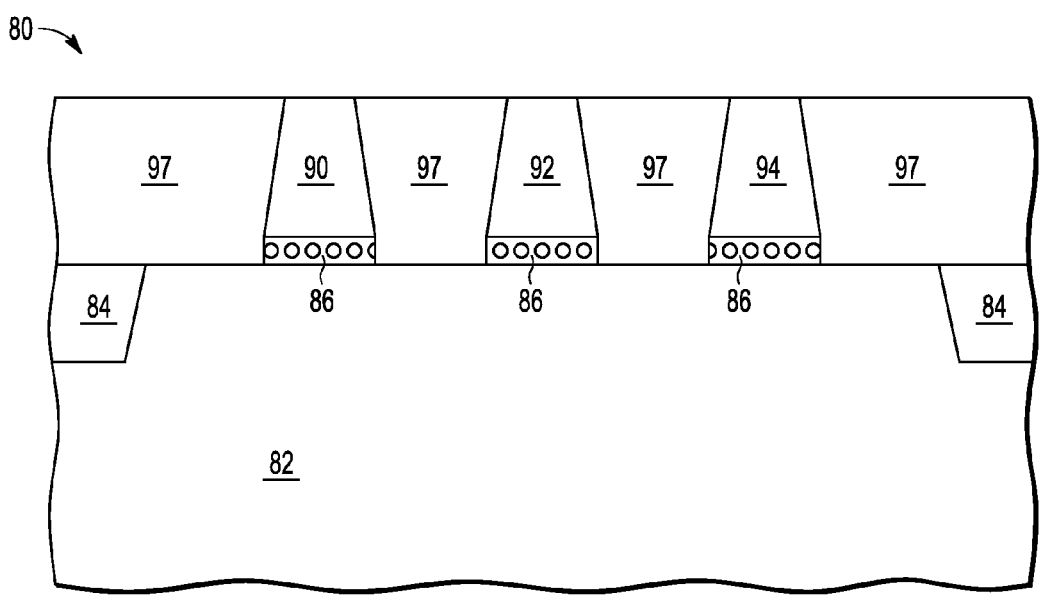

FIG. 18 illustrates a cross-section of multi-state non-volatile memory cell 80 after a conventional chemical mechanical polishing (CMP) procedure is used to remove a top portion of insulating layer 97. As illustrated in FIG. 18, in one embodiment, insulating layer 97 is polished down to the tops of gates 90, 92, and 94.

Figure 19:
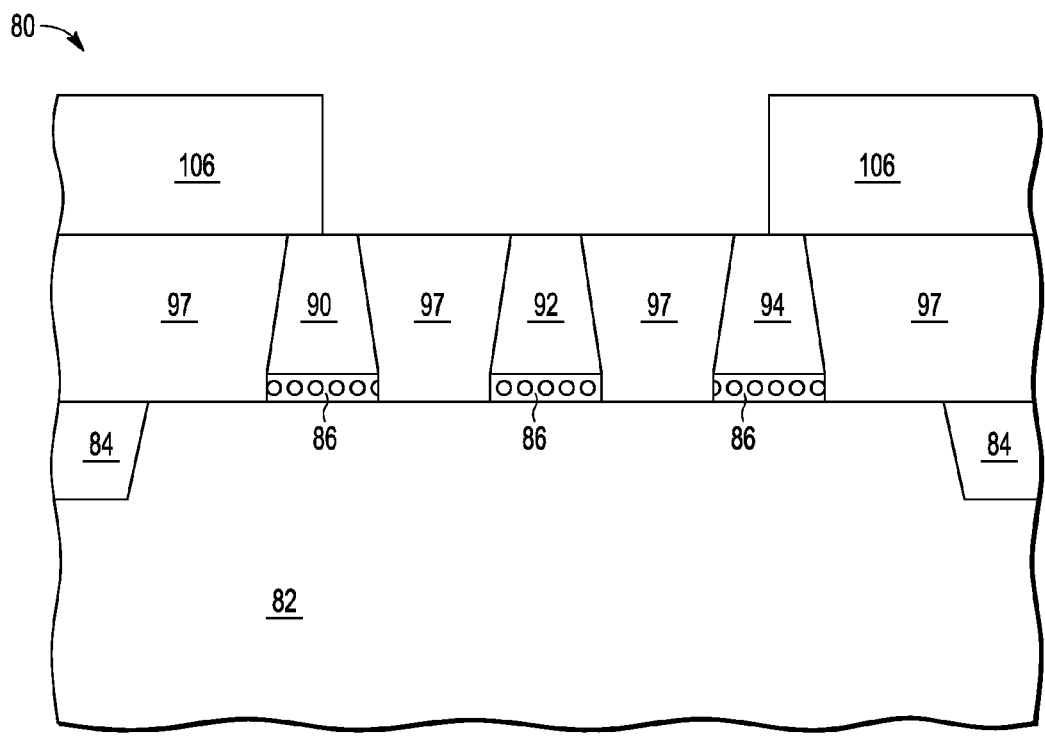

FIG. 19 illustrates a cross-section of multi-state non-volatile memory cell 80 after a photoresist layer 106 is formed over insulating layer 97 and patterned to open an area between outermost gates 90 and 94.

Figure 20:
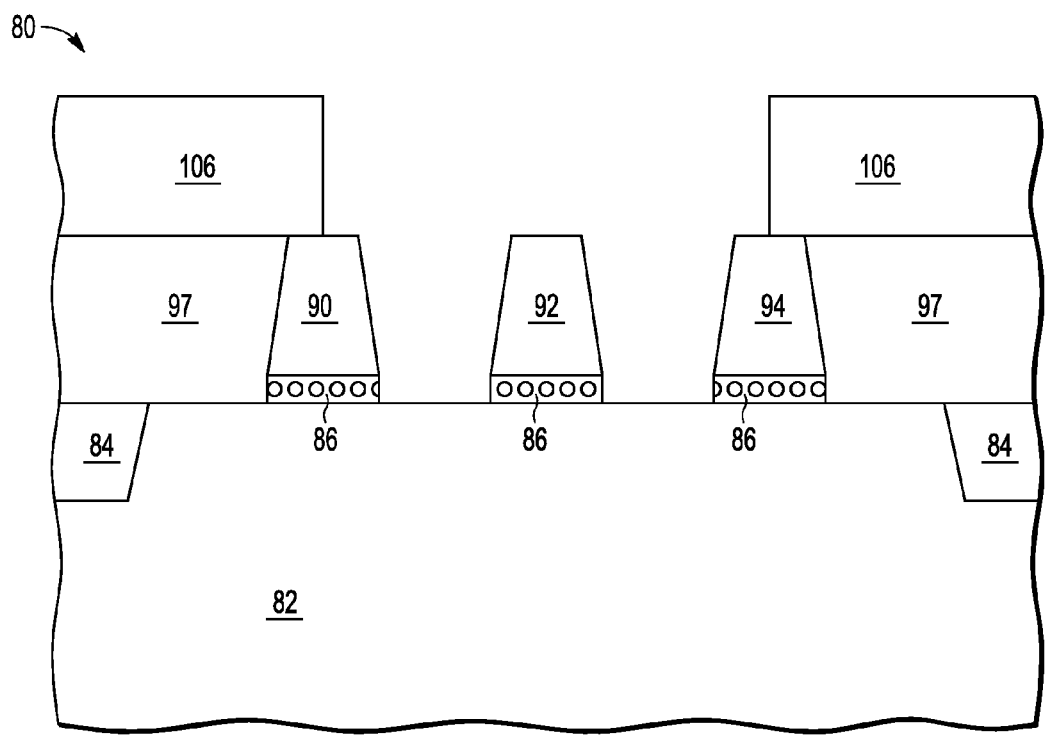

FIG. 20 illustrates a cross-section of multi-state non-volatile memory cell 80 after portions of insulating layer 97 are removed from between gates 90 and 92 and from between gates 92 and 94.

Figure 21:
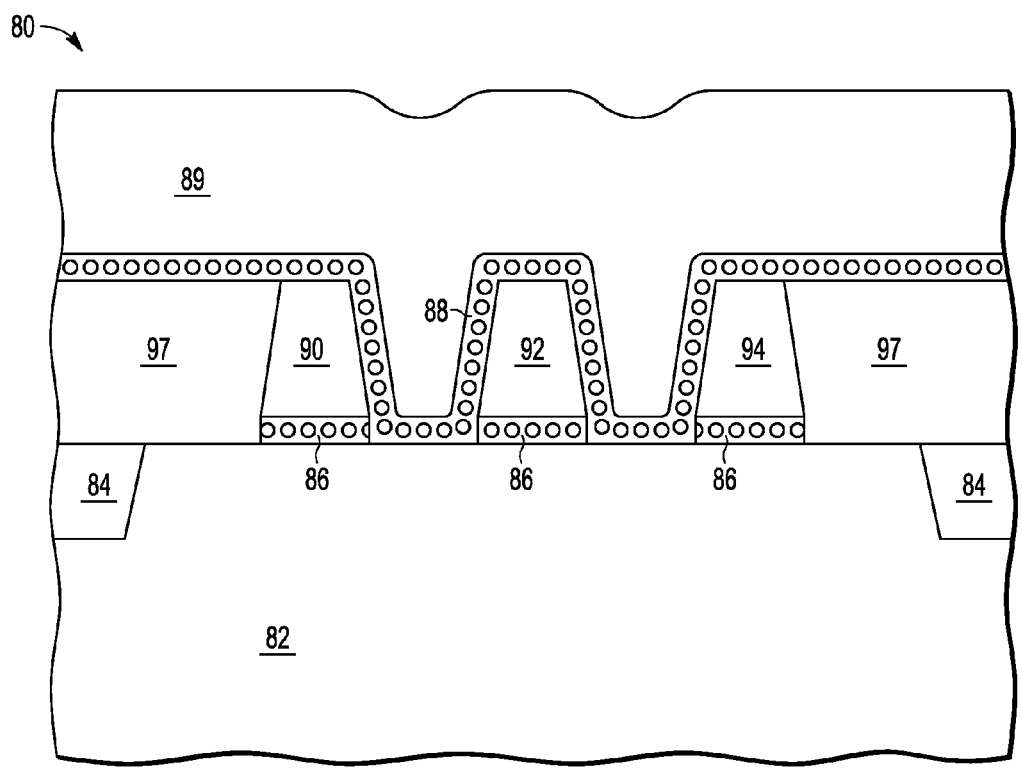

FIG. 21 illustrates a cross-section of multi-state non-volatile memory cell 80 after a polysilicon layer 89 is deposited over a charge storage layer 88. Charge storage layer 88 is over gates 90, 92, and 94, over substrate 82 between the gates, and over insulating layer 97. Charge storage layer 88 is formed to be substantially the same as charge storage layer 86. Polysilicon layer 89 may be formed by depositing polysilicon. Generally, in one embodiment, polysilicon layer 89 comprises the same type of material used in gates 90, 92, 94.

Figure 22:
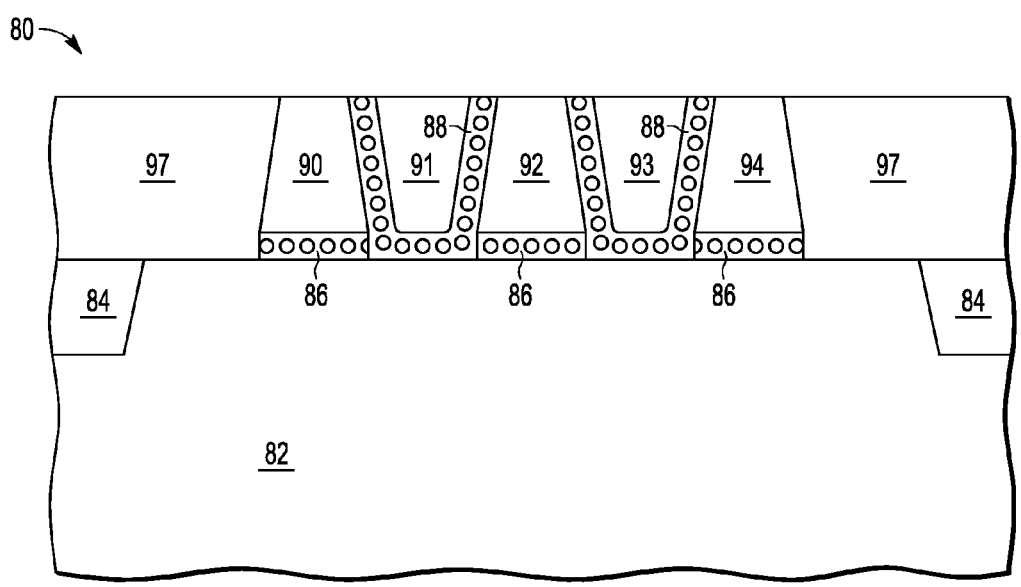

FIG. 22 illustrates a cross-section of multi-state non-volatile memory cell 80 after a conventional CMP process is used to remove a portion of polysilicon layer 89. In one embodiment, polysilicon layer 89 and charge storage layer 88 are removed to the tops of gates 90, 92, and 94 to form gates 91 and 93. As can be seen in FIG. 22, gates 90, 91, 92, 93, and 94 are isolated from each other by only the insulating layers that form a portion of charge storage layers 86 and 88.

Figure 23:
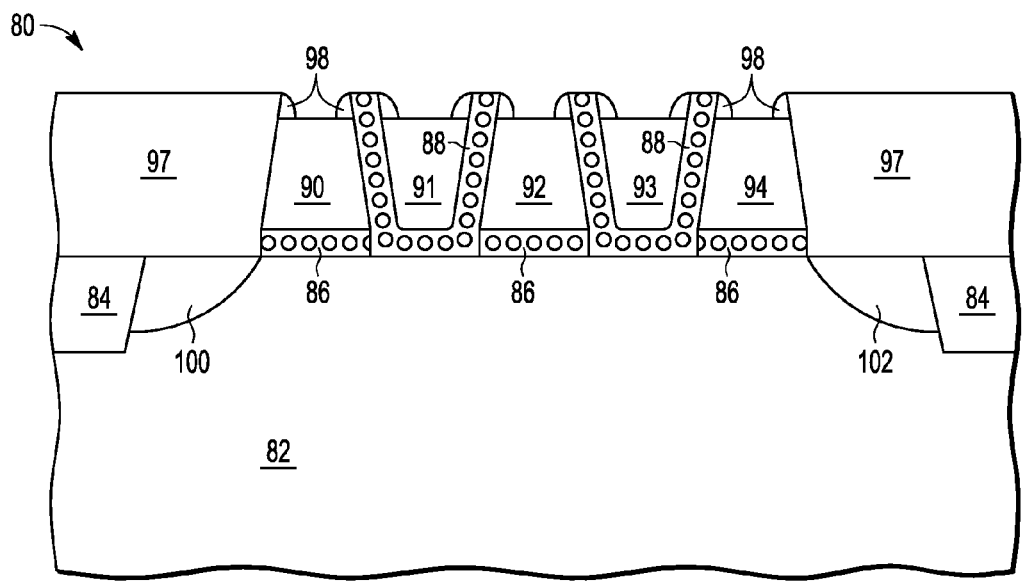

FIG. 23 illustrates a cross-section of multi-state non-volatile memory cell 80 after N+ source and drain regions 100 and 102 are implanted in substrate 82. An upper portion of polysilicon gates 90-94 is removed using an etch selective to oxide and nitride, thereby leaving a portion of charge storage layer 88 exposed. Nitride sidewall spacers 98 are formed on the sides of the exposed portions of charge storage layer 88 and on exposed edges of insulating layer 97 over gates 90 and 94. Nitride sidewall spacers are formed by first depositing a thin nitride layer. The thin nitride layer is etched to form spacers 98.

Figure 24:
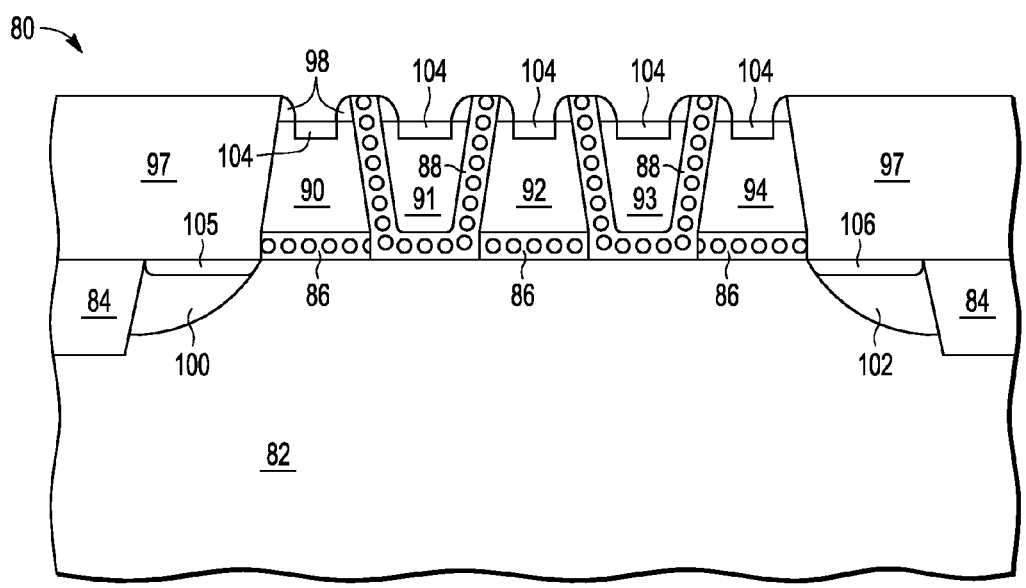

FIG. 24 illustrates a cross-section of multi-state non-volatile memory cell 80 after gates 90-94, source region 100, and drain region 102 are silicided with metal silicide 104. Source/drain region 100 is silicided with silicide 105 and source/drain region 102 is silicided with silicide 106. A silicide block layer (not shown) is first deposited on both sides of the regions to be silicided in a direction perpendicular to the plane of FIG. 24 so that the silicided regions are not shorted together. Spacers 98 prevent silicide bridging on the tops of gates 90-94.

FIG. 25 illustrates a cross-section of multi-state non-volatile memory cell 80 after additional polishing to remove spacers 98 and the exposed charge storage layer 88. In another embodiment, the additional polishing step may not be performed. Normal processing is then performed to complete other features necessary to complete the device, such as for example, contacts and additional metal layers.

A multi-state non-volatile memory cell constructed in accordance with the above described embodiments provides significantly greater storage for a small amount of surface area and with good data retention.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor device, comprising:
    forming an isolation region surrounding an active region, wherein the active region is in a substrate;
    depositing a first charge storage layer on a top surface of the active region and over the isolation region;
    depositing a first layer comprising one of a group consisting of metal and polysilicon on the active region;
    etching the first layer to leave a first line and a second line of the first layer across the active region and the isolation region;
    after etching the first layer, depositing a second charge storage layer over the active region and the isolation region;
    depositing a second layer comprising one of a group consisting of metal and polysilicon over the second charge storage layer;
    removing portions of the second layer and the second charge storage layer to leave a third line between the first line and the second line and separated from the first line and the second line by a remaining portion of the second charge storage layer;
    forming a drain on a first side of the first line, wherein the first side of the first line is away from the third line;
    forming a source on a first side of the second line, wherein the first side of the second line is away from the third line; and
    doping the first line, the second line, and the third line over the isolation region to a first conductivity type and doping the first line, the second line, and the third line over the active region to a second conductivity type.

2. The method of claim 1, wherein:
    the depositing the first layer is further characterized as depositing the first layer on the isolation region;
    the etching the first layer leaves the first line and the second line on the isolation region;
    the depositing the second charge storage layer deposits the second charge storage layer over the isolation region; and the removing leaves the third line between the first and second lines and separated from the first and second lines by the second charge storage layer over the isolation region.

3. The method of claim 2, wherein the depositing the first layer comprises depositing polysilicon and the depositing the second layer comprises depositing polysilicon.

4. The method of claim 1, wherein:
the etching the first layer leaves a fourth line of the first layer across the active region; and
the removing portions of the second layer and the second charge storage layer leaves a fifth line between the second line and the fourth line separated from the second line and the fourth line by a second remaining portion of the second charge storage layer, wherein the removing portions comprises chemical mechanical polishing.

5. A method of making a semiconductor device, comprising:
forming an isolation region surrounding an active region, wherein the active region is in a substrate;
depositing a first charge storage layer on a top surface of the active region and on the isolation region;
depositing a first layer of polysilicon on the active region;
etching the first layer to leave a first line and a second line of the first layer across the active region and on the isolation region;
after etching the first layer, depositing a second charge storage layer over the active region and on the isolation region;
depositing a second layer of polysilicon over the second charge storage layer;
removing portions of the second layer and the second charge storage layer to leave a third line between the first line and the second line, wherein the third line remains across the active region and on the isolation region, and the third line is separated from the first line and the second line by a remaining portion of the second charge storage layer;
forming a drain on a first side of the first line, wherein the first side of the first line is away from the third line;
forming a source on a first side of the second line, wherein the first side of the second line is away from the third line; and
doping the first line, the second line, and the third line over the isolation region to p type and doping the first line, the second line, and the third line over the active region to n type.

6. The method of claim 5, wherein:
the forming the isolation region further comprises surrounding a second active region;
the depositing the first charge storage layer further comprises depositing the first charge storage layer over the second active region;
the etching the first layer leaves the first line and the second line on the second active region;
the depositing the second charge storage layer deposits the second charge storage layer over the second active region; and the removing leaves the third line between the first and second lines and separated from the first and second lines by the second charge storage layer over the second active region.

7. The method of claim 6, the doping further comprises doping the first line, the second line, and the third line over the second active region to n type.

8. A method of forming a semiconductor device, comprising:
forming an isolation region around an active region of a substrate;
depositing a first charge storage layer comprising nanocrystals over the active region and the isolation region;
forming a first conductive line of polysilicon and a second conductive line of polysilicon across the active region and the isolation region and removing the first charge storage layer between the first and second conductive lines, wherein the first conductive line has a first sidewall facing a first sidewall of the second conductive line;
after forming the first conductive line and the second conductive line, depositing a second charge storage layer comprising nanocrystals over the active region and the isolation region;
forming a third conductive line of polysilicon over the second charge storage layer, the active region, and the isolation region, the third conductive line having a pair of sidewalls, wherein the third conductive line has a bottom surface on the second charge storage layer, the third conductive line is between the first and second conductive lines, and the second storage layer adjoins the pair of sidewalls of the third conductive line, the first sidewall of the first conductive line, and the first sidewall of the second conductive line; and
doping the first conductive line, the second conductive line, and the third conductive line over the isolation region to a first conductivity type and doping the first conductive line, the second conductive line, and the third conductive line over the active region to a different, second conductivity type.

9. The method of claim 8, wherein:
the forming the isolation region further comprises surrounding a second active region;
the depositing the first charge storage layer further comprises depositing the first charge storage layer over the second active region;
the forming the first conductive line and the second conductive line comprises forming the first conductive line and the second conductive line over the second active region;
the depositing the second charge storage layer deposits the second charge storage layer over the second active region; and
the forming the third conductive line comprises forming the third conductive line on the second charge storage layer over the second active region.

10. The method of claim 9, the doping further comprises doping the first conductive line, the second conductive line, and the third conductive line over the second active region to the second conductivity type.

* * * * *